United States Patent
Hakomori

[19]
[11] Patent Number: 6,113,490
[45] Date of Patent: Sep. 5, 2000

[54] WORK UNLOADING METHOD AND SURFACE POLISHING APPARATUS WITH WORK UNLOADING MECHANISM

[76] Inventor: Shunji Hakomori, 2647 Hayakawa, Ayase-shi, Japan

[21] Appl. No.: 09/211,576

[22] Filed: Dec. 14, 1998

[30] Foreign Application Priority Data

Dec. 16, 1997 [JP] Japan ................................. 9-363598

[51] Int. Cl.⁷ .................................................. B24B 32/04
[52] U.S. Cl. ........................... 457/288; 451/10; 451/41; 451/262; 451/388; 451/456
[58] Field of Search ................. 451/41, 10, 262, 451/285–291, 403, 294, 280, 289, 284, 388, 456

[56] References Cited

U.S. PATENT DOCUMENTS 5,174,067 12/1992 Hasegawa et al. .................. 451/291
5,333,413 8/1994 Hashimoto .......................... 451/262

FOREIGN PATENT DOCUMENTS 358217268 12/1983 Japan ................................. 451/288
362136364 6/1987 Japan ................................. 451/288
362136366 6/1987 Japan ................................. 451/288
363120077 5/1988 Japan ................................. 451/291
1-140960 6/1989 Japan .

Primary Examiner—David A. Scherbel
Assistant Examiner—G. Nguyen
Attorney, Agent, or Firm—Snell & Wilmer, L.L.P.

[57] ABSTRACT

The present invention provides a work unloading means capable of unloading polished works safely and promptly from a processing section. This means uses an upper and a lower surface plates 5 and 6 to polish works 4 held by a plurality of carriers 3 that engage a sun gear 1 and an internal gear 2, allows the works 4 to be sucked by the bottom surface of the upper surface plate 5 to lift them together with the plate 5, and then intermittently rotates the lifted upper surface plate 5 by a specified angle increment to transfer the works 4 to an unloading position A, where the works are released from the upper surface plate 5 for unloading.

18 Claims, 3 Drawing Sheets

WORK UNLOADING METHOD AND SURFACE POLISHING APPARATUS WITH WORK UNLOADING MECHANISM

FIELD OF THE INVENTION

The present invention relates to a work unloading method for unloading a polished work safely and reliably from a processing section and to a surface polishing apparatus with an unloading mechanism for implementing the method.

PRIOR ART

A surface polishing apparatus such as a lapping or a polishing machine comprises a sun gear and an internal gear that are coaxially located and that can be rotationally driven; and an upper and a lower surface plates, wherein works such as semiconductor wafers held by a carrier that engages the sun and internal gears so as to produce an epicyclic motion, are sandwiched by the upper and lower surface plates for polishing.

In such a surface polishing apparatus, to automatically unload polished works using an unloading means, the upper surface plate is first lifted, and the lower surface plate and the sun and internal gears are then intermittently rotated by a specified angle increment in order to sequentially transfer the works held by the carrier to a position for unloading.

In this conventional surface polishing apparatus, when the upper surface plate is elevated after polishing, the works may adhere to the bottom surface of the upper surface plate, causing them to potentially rise above the carrier and then slip out from the carrier, thereby preventing a loading means from obtaining them. Alternatively, they may be elevated while adhering to the upper surface plate and may then drop and be broken before reaching their destination. In particular, such problems occur when light works such as semiconductor wafers are polished.

In addition, during the chemical polishing of wafers, the wafers may be degraded during unloading due to the progress of oxidation or etching caused by drying, so they must be unloaded while moving the carrier as fast as possible. Since, however, both the carrier and wafers are very thin, such rapid movement may bring the wafers above their designated spaces on the carrier or cause them to slide under the carrier. Consequently, the wafer is likely to slip out from the carrier. In particular, with rinsing water on the lower surface plate, the carrier and wafers may float; in such cases, the wafers are more likely to slip out from the carrier and cannot be unloaded easily.

To solve these problems, Japanese Patent Publication No. 1-140960 discloses an invention allowing polished works to be sucked by a suction hole in the bottom surface of the upper surface plate, lifting the works together with the upper surface plate, moving a bucket with a liquid vessel beneath upper surface plate, and dropping the works into the bucket for unloading.

This invention solves the conventional problems associated with damage to dropped works or with oxidation or etching effected on a work, but requires the presence of as many buckets as carriers holding works—which must be rotatably configured around the surface plates, thereby increasing the size of the apparatus. It also requires a mechanism for transferring the works received by the plurality of buckets to the subsequent phase of processing.

DISCLOSURE OF THE INVENTION

It is an object of this invention to provide a work unloading method capable of unloading a polished work safely and promptly from a processing section, and a surface polishing apparatus with a small simple mechanism for implementing the method.

To achieve this object, this invention provides an unloading method characterized by allowing a plurality of carriers engaging a sun gear and an internal gear to hold works, allowing the carriers to make an epicyclic motion around the sun gear while using an upper and a lower surface plates to sandwich the works held by each carrier for polishing, allowing each work to be sucked by the bottom surface of the upper surface plate to lift the works together with the upper surface plate, and intermittently rotating the lifted upper surface plate by a specified angle increment to transfer the works to an unloading position, where the works are released from the upper surface plate for unloading.

According to this invention, when the works are unloaded at the unloading position, the works corresponding to one carrier are desirably unloaded at a time. In this case, the works are unloaded by dropping them into pans formed in an unloading means or by allowing them to be sucked by the unloading means.

In addition, this invention provides a polishing apparatus comprising a sun gear located in its center and an internal gear encompassing the sun gear; a plurality of carriers engaging both gears to make an epicyclic motion around the sun gear; an upper and a lower surface plates that sandwich works held by the carriers for polishing; a chuck mechanism including a plurality of suction holes formed at positions corresponding to the works located on the bottom surface of the upper surface plate and a suction pump connected to each suction hole via a solenoid-operated valve, each suction hole and the suction pump mutually communicating when the upper surface plate is elevated after polishing has been finished, the suction holes corresponding to the works transferred to an unloading position being shut off from the suction pump while the works are unloaded by means of intermittent rotation of the upper surface plate; and an unloading means for sequentially unloading the processed works that are lifted while being sucked by the bottom surface of the upper surface plate, starting with a work released from the upper surface plate after being transferred to the unloading position by means of the intermittent rotation of the upper surface plate.

This invention preferably has an adhesion prevention means for preventing the carrier from adhering to the upper surface plate and being raised along with it. This adhesion prevention means can be formed of an engagingly locking member provided on at least one of the sun and internal gears in such a way as to engage the carrier. Alternatively, it may be formed of at least one engagingly locking groove cut into the outer circumferential surface of a plurality of pins forming the teeth of the sun and internal gears.

According to another preferred configuration of this invention, the chuck mechanism includes a fluid supply means for supplying a fluid to the suction holes when the works are released from the upper surface plate.

This invention of the above configuration allows the polished works to be sucked by the upper surface plate to lift them, and sequentially unloads them while intermittently rotating the lifted upper surface plate, thereby enabling the works to be safely unloaded without being dropped and/or otherwise damaged before reaching the unloading position. Compared to the conventional method in which the works held by the carrier on the lower surface plate are unloaded while being intermittently rotated together with the carrier, this invention also enables the works to be unloaded while being fed at a high speed, thereby avoiding problems associated with oxidation or etching caused by drying.

Furthermore, this invention requires only one unloading means, thereby providing a small polishing apparatus of a simple structure.

DETAILED DESCRIPTION

Figure 1:
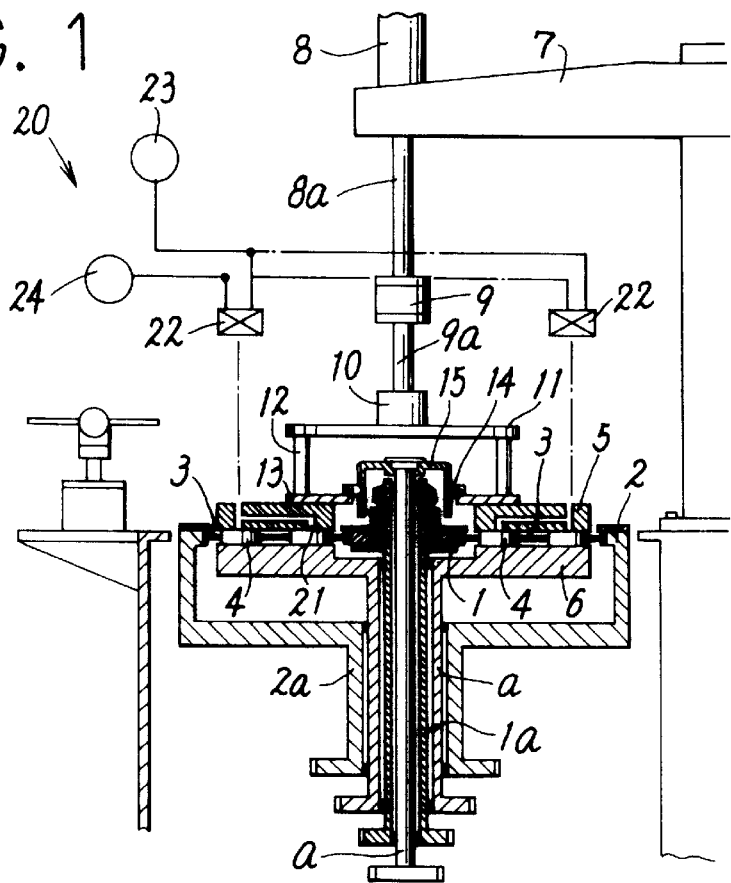
FIG. 1 is a sectional view showing one embodiment of a polishing apparatus according to this invention.
Figure 2:
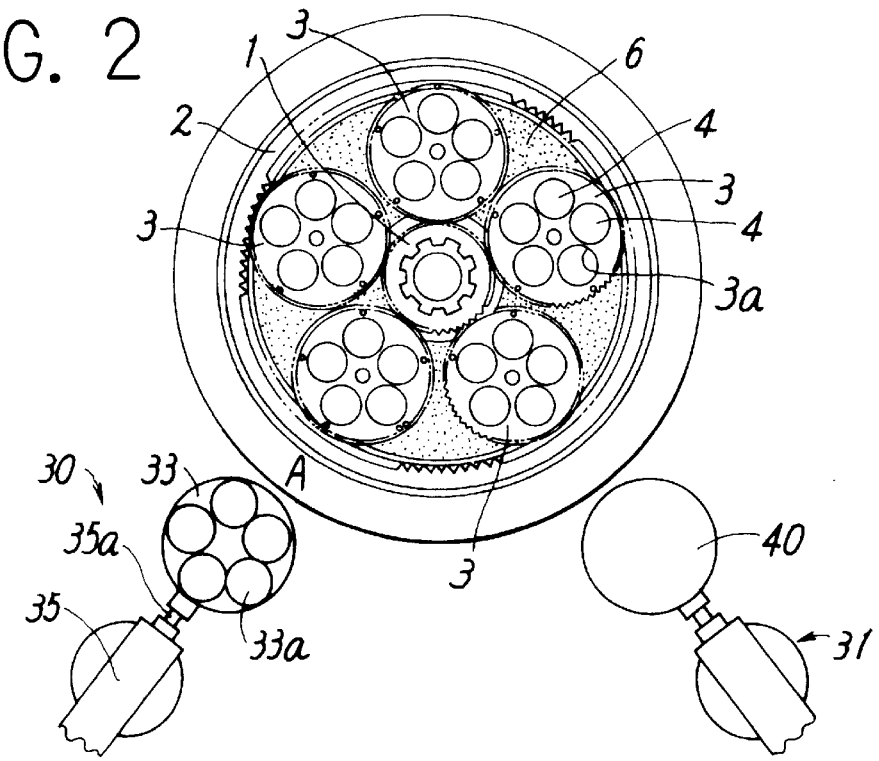
FIG. 2 is a top view showing that an upper surface plate has been elevated in FIG. 1.
Figure 3:
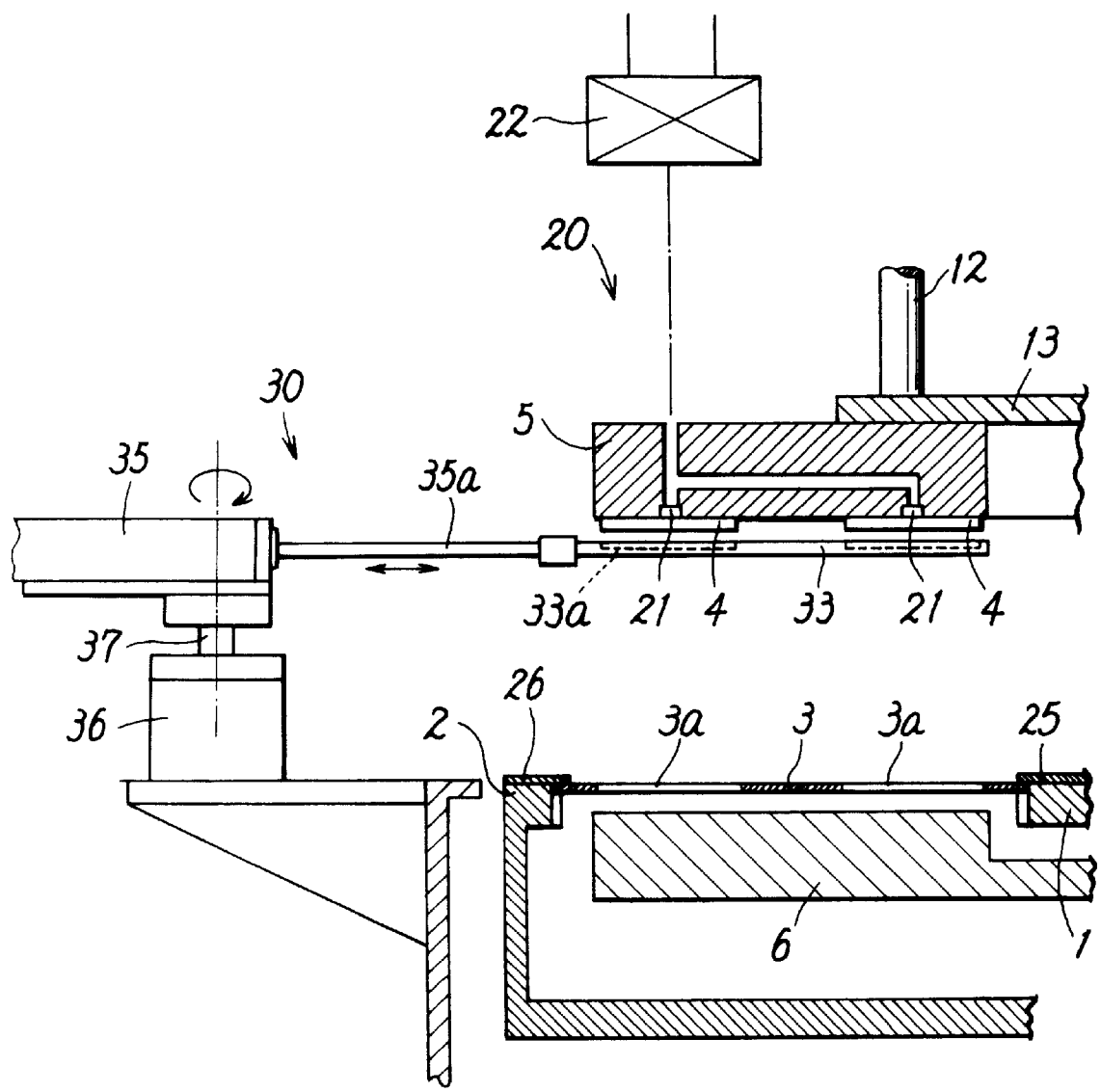
FIG. 3 is an enlarged view showing that works are being unloaded in FIG. 1.

A preferred embodiment of this invention is described below with reference to the drawings. FIGS. 1 to 3 show one embodiment of a surface polishing apparatus with a work unloading mechanism according to this invention. This surface polishing apparatus comprises a sun gear 1 located in its center and an internal gear 2 encompassing the sun gear 1; a plurality of carriers 3 that engage the sun and internal gears 1 and 2 and that follow an epicyclic motion around the sun gear; and an upper and a lower surface plates 5 and 6 that sandwich works 4 held by the carriers 3 for polishing.

The carrier 3 has a plurality of work holding holes 3a located in such a way as to surround its center, and holds and fits the works 4 in the holding holes 3a. The gear ratio and the number of rotations between the carrier 3 and both gears 1 and 2 are set so that each carrier 3 can be stopped at specified revolutionary and rotational positions when polishing has been finished.

The lower surface plate 6 and the sun and internal gears 1 and 2 are attached to drive shafts 1a, 2a, and 6a, respectively, that are disposed coaxially, and these are coupled to a drive apparatus (not shown) via a gear at the lower end of each drive shaft.

The upper surface plate 5 is attached to a rod 8a of an elevating cylinder 8 set in a support frame 7 of a machine body, via a pressurizing cylinder 9 that pressurizes the upper surface plate 5, a pressurizing rod 9a that extends from the pressurizing cylinder 9, a surface plate suspension 11 attached to the lower end of the pressurizing rod via an automatic aligning bearing 10, a plurality of studs 12 dangling from the surface plate suspension 11, and relay plates 13 fixed to the lower ends of the studs 12. At the work processing position of the apparatus shown in FIG. 1 and at the intermediate position for work unloading shown in FIG. 3, an engagingly locking member 14 on the relay plate 13 engages a driver 15 at the upper end of a drive shaft 5a and is driven by the drive apparatus via the driver 15. At an upper-end position above the intermediate position, the engagingly locking member 14 is disengaged from the driver 15.

The polishing apparatus has a chuck mechanism 20 operative when polishing has been finished, which acts to allow the work 4 to be sucked by the bottom surface of the upper surface plate 5 and lifted upward. The chuck mechanism 20 has a plurality of suction holes 21 opened at positions corresponding to the works 4 on the bottom surface of the upper surface plate 5, and a suction pump 23 connected to the suction holes 21 via solenoid-operated valves 22. When the solenoid-operated valve 22 is turned on to allow the suction hole 21 and suction pump 23 to communicate mutually, the work 4 is sucked. When the solenoid-operated valve 22 is turned off to open the suction hole 21 to the atmosphere, the work 4 is released.

The suction holes 21 corresponding to a plurality of (in the illustrated example, five) works 4 held by a single carrier 3 are in mutual communication and are connected to the suction pump 23 via the single solenoid-operated valve 22 so that the solenoid-operated valve 22 is turned on or off to simultaneously suck or release the plurality of works 4 corresponding to the single carrier. According to this embodiment, five solenoid-operated valves 22 are provided so as to correspond to the respective carriers 3. When polishing has been finished to cause the upper surface plate 5 to rise, these solenoid-operated valves 22 are simultaneously turned on to allow all works 4 to be sucked by the upper surface plate 5. When the upper surface plate 5 is intermittently rotated to transfer the works corresponding to any carrier to an unloading position A (see FIG. 2), the corresponding solenoid-operated valves 22 are turned off to simultaneously release from the upper surface plate 5 the five works 4 at the unloading position A.

To ensure that the works 4 are released from the upper surface plate 5 during unloading, a fluid supply source 24 capable of supplying a fluid such as air, nitrogen, or water may be provided, and the suction holes 21 may be connected to the fluid supply source 24 instead of using the solenoid-operated valves 22 to open the suction holes 21 to the atmosphere.

In addition, in the illustrated embodiment, for explanation, the suction holes 21 rotated together with the upper surface plate 5 and the solenoid-operated valves 22 fixedly mounted on a support frame 7 at appropriate positions are shown to be directly connected together via a piping 25. In actuality, of course, a pipe leading to each suction hole 21 and a pipe leading to the solenoid-operated valve 22 are connected together via a fluid joint.

To prevent the carrier 3 from adhering to the bottom surface of the upper surface plate 5 and being lifted together with it when the works 4 are sucked and elevated by the upper surface plate 5, the sun and internal gear 1 and 2 is each equipped with an adhesion prevention means. The adhesion prevention means consists of a disc- or ring-shaped engagingly locking members 26 and 27 mounted on all or part of the top surfaces of the sun and internal gears 1 and 2 in such a way as to protrude inward and allow the engagingly locking members 26 and 27 to be engagingly locked on the top surface of the carrier 3. Adequate adhesion prevention can be achieved by providing the engagingly locking member 26 or 27 on only one of the sun and internal gears 1 and 2.

Also, the adhesion prevention means is not limited to this configuration but may be configured in any manner as long as it can be engagingly locked onto the carrier 3 to restrict undesirable elevation of the carrier.

The surface polishing apparatus has one unloading means 30 for receiving from the upper surface plate 5, processed works 4 lifted simultaneously with the elevation of the upper surface plate 5 while being sucked by the bottom surface of the upper surface plate 5 and then transferring the works 4; and one loading means 31 for feeding unprocessed works 4 onto each carrier 3 after the works 4 on the lower surface plate 6 have been unloaded.

The unloading means 30 has on the top surface of an unloading head 33, as many shallow pans 33a as the works 4 corresponding to the single carrier, so that the works 4 released from the upper surface plate 5 are received by the pans 33a for unloading. The unloading head 33 is attached to the tip of a rod 35a of a cylinder 35 in such a way as to move forward and backward, and the cylinder 35 is supported on the upper end of a support shaft 37 that can be swiveled by a motor 36 around a vertical shaft.

Thus, when the upper surface plate 5 sucks the works 4 and rises together with them, the unloading head 33, which has been located at its standby position, swivels around the support shaft 37 while being moved forward by the cylinder 35 to a receiving position under the bottom surface of the upper surface plate 5. The head receives the works 4 released from the upper surface plate 5, and then swivels and transfers the works 4 to the exterior. The transferred works 4 are unloaded from the unloading head 33 using an appropriate means (not shown).

Once the works 4 corresponding to the single carrier have been unloaded from the upper surface plate 5, the plate 5 rotates by a specified angle to transfer the subsequent works to the unloading position A, where the works are similarly unloaded by the unloading means 30. Similar operations are sequentially repeated to unload all works 4.

The loading means 31 has a suction head 40 that can vacuum-suck works and that can be swiveled and moved in the vertical direction, and uses the suction head 40 to collect such unprocessed works and fit them into the holding holes 3a in the carrier 3. The works 4 are supplied to each of the carriers 3 as the latter is sequentially fed to a supply position as the sun and internal gears and 2 intermittently rotate by a specified angle. In such a case, the works 4 corresponding to the single carrier may be held simultaneously for supply or only a single work at a time may be held.

In the surface polishing apparatus of the above configuration, when the works 4 are supplied to each carrier 3 from the loading means 31, the sun and internal gears 1 and 2 rotate to cause the carrier 3 to revolve around the sun gear while rotating around its own axis, thereby allowing the works 4 held by the carrier 3 to be polished by the upper and lower surface plates 5 and 6, as shown in FIG. 1.

Once polishing has been finished, the rotational speeds of both gears 1 and 2 and both surface plates 5 and 6 decrease gradually and the gears and surface plates stop when any of the carriers 3 reaches the unloading position A at a required rotation angle. In this case, the rotation angles of the carriers 3 are the same. The carrier 3 can be stopped at the unloading position A by using a sensor to detect a measurement position provided on the carrier 3 or upper or lower surface plate 5 or 6.

Then, as shown in FIG. 3, the chuck mechanism 20 allows each work 4 to be sucked by the bottom surface of the upper surface plate 5, which then rises to an intermediate position suitable for unloading the work.

In this case, since the carrier 3 is engagingly locked onto the engagingly locking members 26 and 27 provided on the top surfaces of the sun and internal gears 1 and 2, it cannot rise together with the upper surface plate 5 while adhering to it.

Next, when the unloading head 33 of the unloading means 30 swivels and moves forward to locate itself beneath the bottom surface of the upper surface plate 5, the works 4 at the unloading position A are released from the upper surface plate 5 and transferred onto the unloading head 33, either because the solenoid-operated valves 22 open the suction holes 21 to the atmosphere or because the suction holes are connected to the fluid supply means 23.

Once the works have been released by a fluid supplied by the fluid supply means, the fluid supply means 23 is shut off in response to the completion of the release.

The other works that are not located at the unloading position remain sucked by the upper surface plate 5.

The unloading head 33, which has received the works 4 released from the upper surface plate 5, swivels to transfer the works 4 to the exterior. The head supplies the works to a transfer means (not shown) for the subsequent process and then moves to locate itself again beneath the bottom surface of the upper surface plate 5.

The upper surface plate 5 rotates by a specified angle to transfer the subsequent works to the unloading position A. In this case, to preclude a change in the locational relationship between the suction holes 21 in the upper surface plate 5 and the carriers 3, the sun and internal gears 1 and 2 may be rotated to cause the carriers 3 to revolve intermittently in synchronism with the upper surface plate while not rotating around its own axis.

The unloading of all works 4 is completed by repeating the above two operations (i.e., in which the unloading head 33 moves to locate itself beneath the bottom surface of the upper surface plate 5 to receive the works 4 at the unloading position A for transfer; and in which the upper surface plate 5 rotates by a specified angle to transfer the subsequent works 4 to the unloading position A).

At the same time, in parallel with the unloading of the works 4 or after unloading has been completed, the loading means 31 sequentially loads the unprocessed works 4 onto each carrier 3 on the lower surface plate 6 while intermittently revolving the carriers 3 by a specified angle.

Once the unloading and loading of the works has been completed, the upper surface plate 5 lowers, the works are polished again, and the above operations are repeated.

Although, in the above embodiment, the unloading means 30 drops the works into the pans provided in the top surface of the unloading head 33 and unloads the works therefrom, suction holes may be provided in the unloading head 33 to suck and unload the works.

In addition, to reduce the time required to unload processed works, two unloading heads 33 are provided in the unloading means 30 to alternately unload the works transferred to the unloading position A.

Although, in the above embodiment, the driver 15 drives the upper surface plate 5 from the lower surface plate 6 side, a drive means provided on the support frame 7 may drive the upper surface plate 5 from above without providing the driver 15. In this case, the upper surface plate 5 does not need to be stopped at an intermediate height to unload the works 4; instead, it can be lifted up to the elevation end and the works unloaded there.

Figure 4:
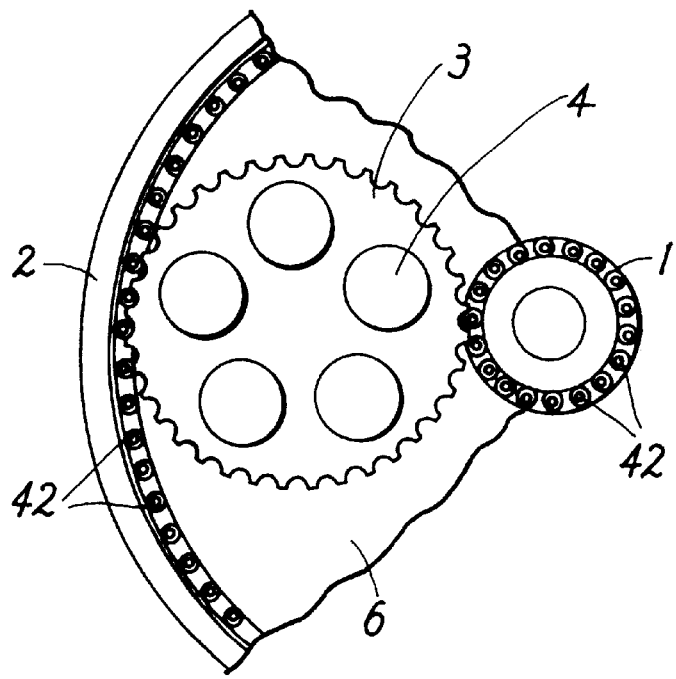
FIG. 4 is a top view of the integral part of another example of a configuration of a carrier adhesion prevention means.
Figure 5:
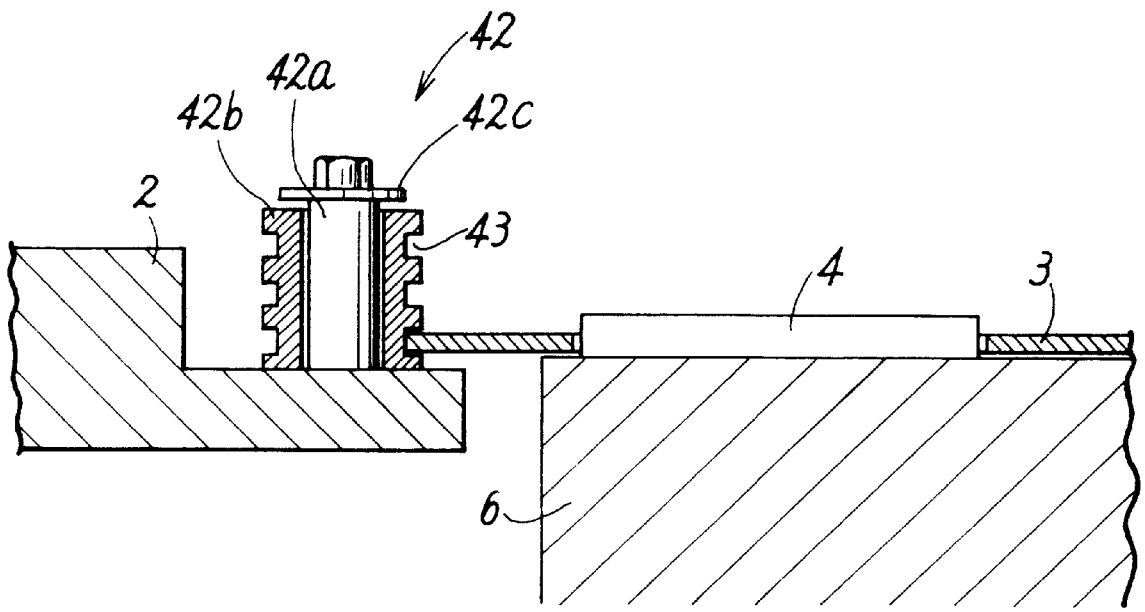
FIG. 5 is an enlarged sectional view of the integral part of FIG. 4.

FIGS. 4 and 5 show another example of a configuration of the adhesion prevention means for preventing the carrier from rising while adhering to the bottom surface of the upper surface plate. In this example, the teeth of the sun and internal gears 1 and 2 are composed of a plurality of pins 42 positioned at a specified pitch wherein a plurality of engagingly locking grooves 43 forming the adhesion prevention means are cut into the outer circumferential surface of each pin, such that the carrier 3 engages each pin 42 at the position of any of the engagingly locking grooves 43 and does not adhere to the upper surface plate. Although a plurality of engagingly locking grooves 43 are formed in the vertical direction so as to change the height of the carrier depending on the thickness of the work 4, only a single groove may be provided if the height of the carrier does not need to be changed.

In addition, the pin 42 desirably comprises a base shaft 42a around which a cylindrical collar 42b of synthetic resin or metal is rotatably fitted, with the engagingly locking grooves 43 cut into the collar 42b.

Alternatively, instead of providing the engagingly locking grooves 43, a washer 42c of a large diameter for preventing the collar 42b from slipping out may be provided as an engagingly locking member so that the carrier 3 can be engagingly locked onto the washer.

As described above, this invention lifts polished works while adhering them to the upper surface plate and then intermittently rotates the lifted upper surface plate to transfer the works to an unloading position for sequential unloading, thereby enabling the works to be unloaded safely and reliably without being dropped and/or otherwise damaged. In addition, compared to the conventional method in which the works held by the carrier on the lower surface plate are unloaded while being intermittently rotated together with the carrier, this invention also prevents any hindrance during unloading caused by the works slipping out from the carrier and hence enables the works to be reliably unloaded while being fed at a high speed. Consequently, it is effective for preventing oxidation or etching caused by drying.

Furthermore, this invention does not require an unloading means to be provided for each carrier, thereby providing a small polishing apparatus of a simple structure.

What is claimed is:

1. A work unloading method allowing a plurality of carriers engaging a sun gear and an internal gear to hold works, allowing the carriers to follow an epicyclic motion around the sun gear while using an upper and a lower surface plates to sandwich the works held by each carrier for polishing, allowing each work to be sucked by the bottom surface of the upper surface plate to lift the works together with the upper surface plate, and intermittently rotating the upper surface plate by a specified angle increment to transfer the works to an unloading position, where the works are released from the upper surface plate for unloading.

2. An unloading method according to claim 1 wherein at said unloading position, the works corresponding to one carrier are unloaded at a time.

3. An unloading method according claim 1 wherein the works released from the upper surface plate at said unloading position are unloaded by being dropped into pans formed in an unloading means.

4. An unloading method according to claim 1 wherein the works released from the upper surface plate at said unloading position are unloaded by allowing them to be sucked by the unloading means.

5. A surface polishing apparatus comprising:
    a sun gear located in its center;
    an internal gear encompassing said sun gear;
    a plurality of carriers engaging both of said gears so as to follow an epicyclic motion around the sun gear;
    an upper and a lower surface plates that sandwich works held by said carriers for polishing;
    a chuck mechanism including a plurality of suction holes formed at positions corresponding to the works on the bottom surface of said upper surface plate and a suction pump connected to the suction hole via a solenoid-operated valve, each suction hole and the suction pump mutually communicating when the upper surface plate is elevated after polishing has been finished, the suction holes corresponding to the works transferred to an unloading position being shut off from the suction pump while the works are unloaded by means of intermittent rotation of the upper surface plate; and
    an unloading means for sequentially unloading the processed works that are lifted while being sucked by the bottom surface of the upper surface plate, starting with a work released from the upper surface plate after being transferred to the unloading position by means of the intermittent rotation of the upper surface plate.

6. A surface polishing apparatus according to claim 5 having an adhesion prevention means operative during the elevation of said upper surface plate for preventing the carrier from adhering to the upper surface plate and rising along with it.

7. A surface polishing apparatus according to claim 6 wherein said adhesion prevention means consists of an engagingly locking member provided on at least one of the sun and internal gears in such a way as to engage the carrier.

8. A surface polishing apparatus according to claim 6 wherein said adhesion prevention means consists of at least one engagingly locking groove cut into the outer circumferential surface of a plurality of pins forming the teeth of the sun and internal gears and wherein the carrier meshes said pins at the position of the engagingly locking groove.

9. A surface polishing apparatus according to claim 5 wherein said chuck mechanism includes a fluid supply means for supplying a fluid to said suction holes when the works are released from the upper surface plate.

10. A surface polishing apparatus according to claim 5 having a loading means for supplying unprocessed works to said carrier on the lower surface plate.

11. An unloading method according claim 2 wherein the works released from the upper surface plate at said unloading position are unloaded by being dropped into pans formed in an unloading means.

12. An unloading method according to claim 2 wherein the works released from the upper surface plate at said unloading position are unloaded by allowing them to be sucked by the unloading means.

13. A surface polishing apparatus according to claim 6 wherein said chuck mechanism includes a fluid supply means for supplying a fluid to said suction holes when the works are released from the upper surface plate.

14. A surface polishing apparatus according to claim 7 wherein said chuck mechanism includes a fluid supply means for supplying a fluid to said suction holes when the works are released from the upper surface plate.

15. A surface polishing apparatus according to claim 8 wherein said chuck mechanism includes a fluid supply means for supplying a fluid to said suction holes when the works are released from the upper surface plate.

16. A surface polishing apparatus according to claim 6 having a loading means for supplying unprocessed works to said carrier on the lower surface plate.

17. A surface polishing apparatus according to claim 7 having a loading means for supplying unprocessed works to said carrier on the lower surface plate.

18. A surface polishing apparatus according to claim 8 having a loading means for supplying unprocessed works to said carrier on the lower surface plate.

* * * * *